(12) United States Patent
Kim

(10) Patent No.: US 11,043,403 B2
(45) Date of Patent: Jun. 22, 2021

(54) SUBSTRATE SUPPORT UNIT AND SUBSTRATE PROCESSING APPARATUS HAVING THE SAME INCLUDING REFLECTIVE MEMBER CONFIGURED TO REFLECT LIGHT TOWARD SUBSTRATE

(71) Applicant: SEMES CO., LTD., Chungcheongnam-do (KR)

(72) Inventor: Hyun-Su Kim, Hwaseong-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 275 days.

(21) Appl. No.: 16/371,533

(22) Filed: Apr. 1, 2019

(65) Prior Publication Data
US 2019/0311923 A1 Oct. 10, 2019

(30) Foreign Application Priority Data

Apr. 6, 2018 (KR) .......................... 10-2018-0040544
Mar. 15, 2019 (KR) .......................... 10-2019-0030155

(51) Int. Cl.
*H01L 21/67* (2006.01)
*H01L 21/687* (2006.01)

(52) U.S. Cl.
CPC .... *H01L 21/67115* (2013.01); *H01L 21/6708* (2013.01); *H01L 21/67051* (2013.01); *H01L 21/68764* (2013.01)

(58) Field of Classification Search
CPC ......... H01L 21/67115; H01L 21/68764; H01L 21/6708; H01L 21/67051; H01L 21/6875; H01L 21/68728
See application file for complete search history.

(56) References Cited

U.S. PATENT DOCUMENTS

| 6,080,965 | A | * | 6/2000 | Osawa | ............. H01L 21/67115 118/725 |
| 2014/0045281 | A1 | * | 2/2014 | Aiura | ................ H01L 21/68792 438/16 |
| 2017/0032983 | A1 | * | 2/2017 | Muta | ....................... G03F 7/168 |

(Continued)

FOREIGN PATENT DOCUMENTS

KR  10-1073435 B  10/2011
KR  10-1155026 B  6/2012

(Continued)

OTHER PUBLICATIONS

Korean Patent Office, Office action dated May 28, 2020.
Korean Patent Office, Notice of Allowance dated Oct. 21, 2020.

*Primary Examiner* — John P. Dulka
(74) *Attorney, Agent, or Firm* — Li & Cai Intellectual Property (USA) Office

(57) ABSTRACT

The inventive concept relates to a substrate support unit. The substrate support unit includes a chuck stage having an inner space defined by a base surface and sidewalls, a heating unit provided in the inner space, the heating unit including a base plate having a disk shape with an opening in the center and a heat generation part mounted on the base plate and having heating light sources that emit light energy, a quartz window that covers the inner space and has an upper surface on which a substrate is placed, and a reflective member that reflects light energy lost in a lateral direction of the chuck stage toward the substrate.

27 Claims, 10 Drawing Sheets

(56) References Cited

U.S. PATENT DOCUMENTS

2019/0318946 A1* 10/2019 Kim ................... H01L 21/6708
2021/0043478 A1* 2/2021 Ishimoto ............... H01L 21/324

FOREIGN PATENT DOCUMENTS

| KR | 1020130074562 A | 7/2013 |
| KR | 10-1324210 B | 10/2013 |
| KR | 1020140018915 A | 2/2014 |
| KR | 1020160008065 A | 1/2016 |
| KR | 10-1681183 B | 11/2016 |
| KR | 1020170135714 A | 12/2017 |

* cited by examiner

SUBSTRATE SUPPORT UNIT AND SUBSTRATE PROCESSING APPARATUS HAVING THE SAME INCLUDING REFLECTIVE MEMBER CONFIGURED TO REFLECT LIGHT TOWARD SUBSTRATE

CROSS-REFERENCE TO RELATED APPLICATIONS

A claim for priority under 35 U.S.C. § 119 is made to Korean Patent Application No. 10-2018-0040544 filed on Apr. 6, 2018 and No. 10-2019-0030155 filed on Mar. 15, 2019, in the Korean Intellectual Property Office, the entire contents of which are hereby incorporated by reference.

BACKGROUND

Embodiments of the inventive concept described herein relate to a substrate processing apparatus, and more particularly, relate to a substrate processing apparatus for performing a process while heating a substrate during substrate processing.

In general, various processes such as a photoresist coating process, a developing process, an etching process, an ashing process, and the like are performed to process a glass substrate or a wafer in a process of manufacturing a flat panel display device or a semiconductor.

In each process, a wet cleaning process using chemicals or deionized water and a drying process for drying the chemicals or the deionized water remaining on the surface of a substrate are performed to remove various contaminants adhering to the substrate.

In recent years, an etching process of selectively removing a silicon nitride film and a silicon oxide film by using a chemical solution, such as a sulfuric acid or a phosphoric acid, at high temperature has been used.

A substrate heating apparatus for heating a substrate using IR lamps is applied to a substrate processing apparatus using a high-temperature chemical solution to improve an etch rate.

However, the IR lamps of the conventional substrate heating apparatus are arranged at equal intervals, among which the outermost lamp has a smaller size than the substrate and the innermost lamp has a specified size in view of a central nozzle. Therefore, as depicted in the graph of FIG. 1, the light intensity distributions on the edge and the central region of the substrate rapidly fall.

SUMMARY

Embodiments of the inventive concept provide a substrate heating unit for uniformly heating a substrate during substrate processing, and a substrate processing apparatus having the same.

Embodiments of the inventive concept provide a substrate heating unit for increasing a degree of concentration of light on an edge and a central region of a substrate during substrate processing, and a substrate processing apparatus having the same.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for supporting a substrate includes a chuck stage having an inner space defined by a base surface and sidewalls, a heating unit provided in the inner space, the heating unit including a base plate having a disk shape with an opening in the center and a heat generation part mounted on the base plate and having heating light sources that emit light energy, a quartz window that covers the inner space and has an upper surface on which a substrate is placed, and a reflective member that reflects light energy lost in a lateral direction of the chuck stage toward the substrate.

The reflective member may be provided on an inner surface of an edge of the quartz window that surrounds the heat generation part.

The inner surface of the edge of the quartz window may be inclined so as to be closer to the center of the quartz window from top to bottom.

The inner surface of the edge of the quartz window may be formed to be concave toward an edge of the substrate.

The reflective member may be formed of a reflective plate or a reflective coating film.

The apparatus may further include a rotary part that has a hollow shape and that is combined with the chuck stage to rotate the chuck stage and a back nozzle that is inserted through the rotary part and located in the center of an upper portion of the chuck stage and that sprays a processing liquid onto a rear surface of the substrate.

The heating light sources may be formed of ring-shaped lamps concentrically arranged at different radii with respect to the center of the base plate.

The base plate may be formed of a reflector that reflects light energy of the lamps upwards.

The base plate may include reflective protrusions that are located below the lamps and that protrude in a protrusion shape to spread the light energy radiating from the lamps.

Each of the reflective protrusions may have a triangular cross-section that becomes gradually wider away from the corresponding lamp.

The base plate may further include an inclined reflective surface provided on a central portion of the base plate to increase a degree of concentration of light on a central region of the substrate.

The base plate may further include a convex reflective surface provided on a central portion of the base plate to increase a degree of concentration of light on a central region of the substrate.

The reflective member may be provided on an inner surface of an edge of the quartz window that surrounds the heat generation part and may include a curved reflective surface to concentrate the light energy of the heating light sources on a target at a predetermined location in an edge region of the substrate.

The curved reflective surface of the reflective member may have the shape of part of an ellipse.

A longitudinal section of the curved reflective surface may be part of an elliptical section with a luminous point of the heating light source and the target as two focal points of an ellipse.

The target may be located close to the center of a patterned section in the edge region of the substrate, other than an un-patterned section in the edge region thereof.

According to an exemplary embodiment, an apparatus for processing a substrate includes a processing vessel that is open at the top, a substrate support unit that is located in the processing vessel and that supports the substrate, a processing liquid supply unit that supplies a processing liquid to the substrate placed on the substrate support unit, and a heating unit that is provided in the substrate support unit and that emits light energy for heating the substrate. The substrate support unit includes a chuck stage having an inner space defined by a base surface and sidewalls, a quartz window that covers the inner space and has an upper surface on which the substrate is placed, and a reflective member that reflects light energy lost in a lateral direction of the chuck stage toward the substrate.

The reflective member may be provided on an inner surface of an edge of the quartz window that surrounds the heat generation part.

The inner surface of the edge of the quartz window may be inclined so as to be closer to the center of the quartz window from top to bottom, or may be formed to be concave toward an edge of the substrate.

The heating unit may include a heat generation part that is provided in the substrate support unit and that has ring-shaped lamps concentrically arranged at different radii with respect to the center of the substrate support unit and a reflective plate having reflective protrusions that are located below the lamps and that protrude in a protrusion shape to spread light energy radiating from the lamps.

The substrate support unit may further include a rotary part that has a hollow shape and that is combined with the chuck stage to rotate the chuck stage and a back nozzle that is inserted through the rotary part and located in the center of an upper portion of the chuck stage and that sprays a processing liquid onto a rear surface of the substrate. Each of the reflective protrusions may be formed in a ring shape that has the same diameter as the corresponding lamp and may have a triangular cross-section that becomes gradually wider away from the corresponding lamp.

The reflective plate may further include a reflective surface provided on a central portion of the reflective plate to increase a degree of concentration of light on a central region of the substrate.

The reflective member may be provided on an inner surface of an edge of the quartz window that surrounds the heat generation part and may have a curved reflective surface to concentrate the light energy on a target at a predetermined location in an edge region of the substrate.

The target may be located close to the center of a patterned section in the edge region of the substrate, other than an un-patterned section in the edge region thereof.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
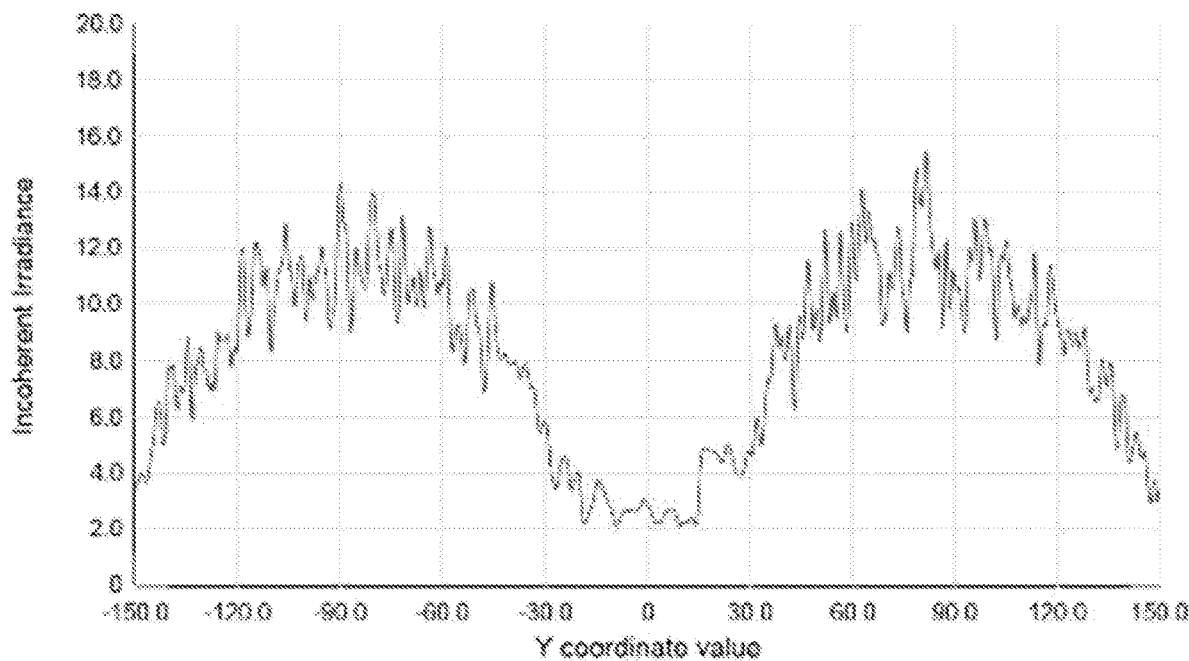
FIG. 1 is a graph depicting a light intensity distribution in a substrate heating apparatus according to the related art.

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

Figure 2:
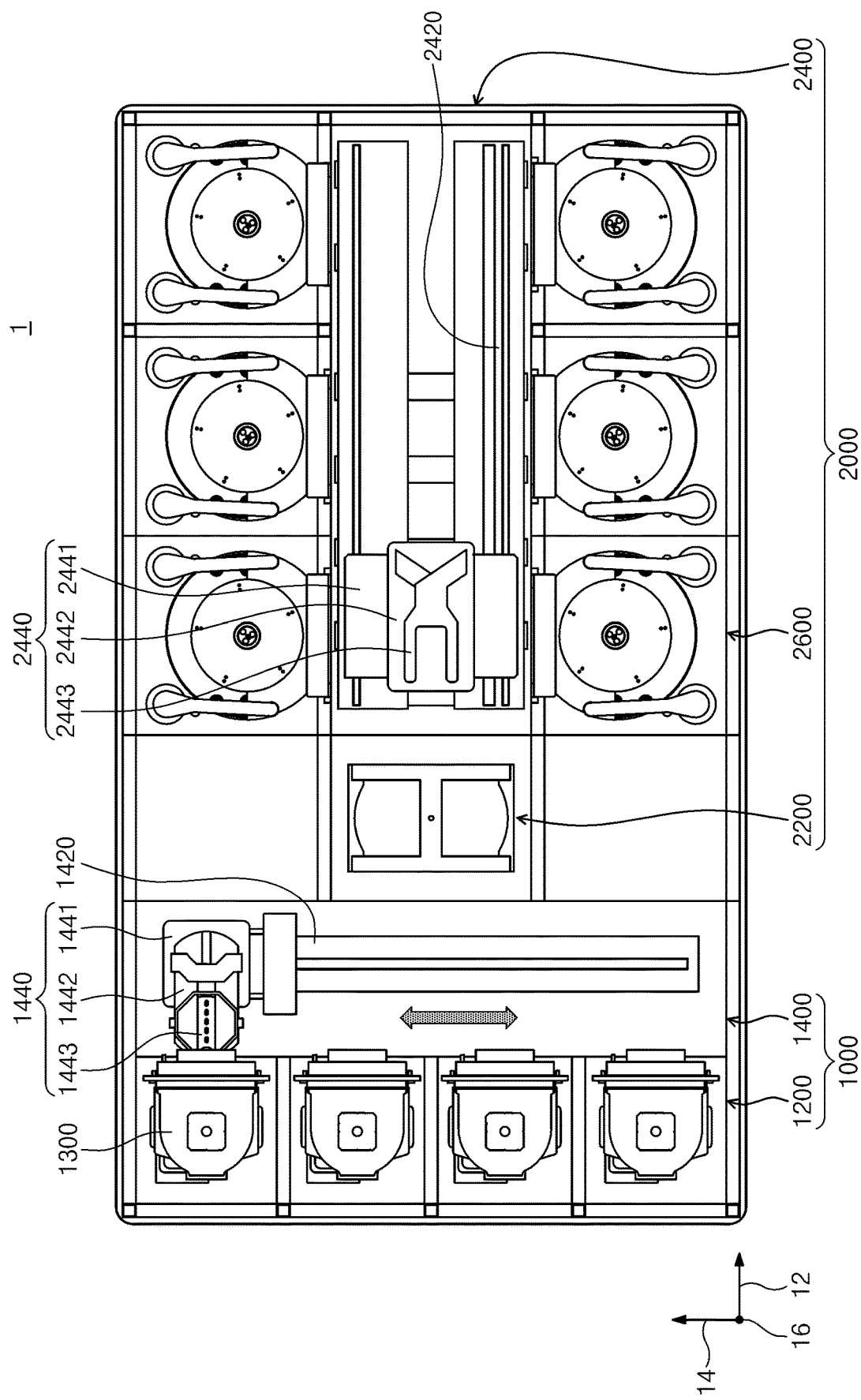
FIG. 2 is a schematic plan view illustrating substrate processing equipment including a substrate processing apparatus according to an embodiment of the inventive concept.

FIG. 2 is a schematic plan view illustrating substrate processing equipment 1 of the inventive concept.

Referring to FIG. 2, the substrate processing equipment 1 includes an index module 1000 and a processing module 2000. The index module 1000 includes a load port 1200 and a transfer frame 1400. The load port 1200, the transfer frame 1400, and the processing module 2000 are sequentially arranged in a row. Hereinafter, the direction in which the load port 1200, the transfer frame 1400, and the processing module 2000 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier 1300 having substrates W received therein is placed on the load port 1200. The index module 1000 may include a plurality of load ports 1200 arranged in a row along the second direction 14. FIG. 1 illustrates an example that the index module 1000 includes four load ports 1200. However, the number of load ports 1200 may be increased or decreased depending on conditions such as process efficiency and footprint of the processing module 2000. The carrier 1300 has a plurality of slots (not illustrated) that are formed therein to support the edges of the substrates W. The plurality of slots are arranged in the third direction 16. The substrates W are stacked one above another in the carrier 1300 and spaced apart from each other along the third direction 16. A front opening unified pod (FOUP) may be used as the carrier 1300.

The processing module 2000 includes a buffer unit 2200, a transfer chamber 2400, and process chambers 2600. The transfer chamber 2400 is arranged such that the longitudinal direction thereof is parallel to the first direction 12. The process chambers 2600 are disposed on opposite sides of the transfer chamber 2400 along the second direction 14. The process chambers 2600 on one side of the transfer chamber 2400 and the process chambers 2600 on the opposite side of the transfer chamber 2400 are located in a symmetric arrangement with respect to the transfer chamber 2400. Some of the process chambers 2600 are arranged along the longitudinal direction of the transfer chamber 2400. Furthermore, some of the process chambers 2600 are stacked one above another along the third direction 16. That is, the process chambers 2600 may be arranged in an A×B array (A and B being natural numbers of 1 or larger) on each side of the transfer chamber 2400. Here, "A" is the number of process chambers 2600 arranged in a row along the first direction 12, and "B" is the number of process chambers 2600 arranged in a column along the third direction 16. In the case where four or six process chambers 2600 are disposed on each side of the transfer chamber 2400, the process chambers 2600 may be arranged in a 2×2 or 3×2 array. The number of process chambers 2600 may be increased or decreased. Alternatively, the process chambers 2600 may be disposed on only one side of the transfer chamber 2400. In another case, the process chambers 2600 may be arranged in a single layer on the opposite sides of the transfer chamber 2400.

The buffer unit 2200 is disposed between the transfer frame 1400 and the transfer chamber 2400. The buffer unit 2200 provides a space in which the substrates W stay before transferred between the transfer chamber 2400 and the transfer frame 1400. The buffer unit 2200 has a plurality of slots (not illustrated) therein, on which the substrates W are placed. The slots (not illustrated) are spaced apart from each other along the third direction 16. The buffer unit 2200 is open at one side facing the transfer frame 1400 and at an opposite side facing the transfer chamber 2400.

The transfer frame 1400 transfers the substrates W between the butter unit 2200 and the carrier 1300 placed on the load port 1200. The transfer frame 1400 includes an index rail 1420 and an index robot 1440. The index rail 1420 is arranged such that the longitudinal direction thereof is parallel to the second direction 14. The index robot 1440 is mounted on the index rail 1420 and linearly moves along the index rail 1420 in the second direction 14. The index robot 1440 has a base 1441, a body 1442, and an index arm 1443. The base 1441 is movable along the index rail 1420. The body 1442 is combined with the base 1441. The body 1442 is movable along the third direction 16 on the base 1441. Furthermore, the body 1442 is rotatable on the base 1441. The index arm 1443 is combined with the body 1442 and is movable forward and backward relative to the body 1442. The index robot 1440 may include a plurality of index arms 1443 that operate individually. The index arms 1443 are stacked one above another along the third direction 16 with a spacing gap therebetween. Some of the index arms 1443 may be used to transfer substrates W from the processing module 2000 to the carrier 1300, and the other index arms 1443 may be used to transfer substrates W from the carrier 1300 to the processing module 2000. Accordingly, particles generated from substrates W to be processed may be prevented from adhering to processed substrates W in the process in which the index robot 1440 transfers the substrates W between the carrier 1300 and the processing module 2000.

The transfer chamber 2400 transfers substrates W between the buffer unit 2200 and the process chambers 2600 and between the process chambers 2600. The transfer chamber 2400 includes a guide rail 2420 and a main robot 2440. The guide rail 2420 is arranged such that the longitudinal direction thereof is parallel to the first direction 12. The main robot 2440 is mounted on the guide rail 2420 and linearly moves along the first direction 12 on the guide rail 2420. The main robot 2440 has a base 2441, a body 2442, and a main arm 2443. The base 2441 is movable along the guide rail 2420. The body 2442 is combined with the base 2441. The body 2442 is movable along the third direction 16 on the base 2441. Furthermore, the body 2442 is rotatable on the base 2441. The main arm 2443 is combined with the body 2442 and is movable forward and backward relative to the body 2442. The main robot 2440 may include a plurality of main arms 2443 that operate individually. The main arms 2443 are stacked one above another along the third direction 16 with a spacing gap therebetween. The main arms 2443 used to transfer substrates W from the buffer unit 2200 to the process chambers 2600 may differ from the main arm 2443 used to transfer substrates W from the process chambers 2600 to the buffer unit 2200.

The process chambers 2600 have substrate processing apparatuses 10 therein, respectively, which perform cleaning processes on substrates W. The substrate processing apparatuses 10 in the respective process chambers 2600 may have different structures according to the types of cleaning processes that the substrate processing apparatuses 10 perform. Alternatively, the substrate treating apparatuses 10 in the respective process chambers 2600 may have the same structure. In another case, the process chambers 2600 may be divided into a plurality of groups. The substrate processing apparatuses 10 in the process chambers 2600 belonging to the same group may have the same structure, and the substrate processing apparatuses 10 in the process chambers 2600 belonging to different groups may have different structures. For example, in the case where the process chambers 2600 are divided into two groups, a first group of process chambers 2600 may be disposed on the one side of the transfer chamber 2400, and a second group of process chambers 2600 may be disposed on the opposite side of the transfer chamber 2400. Alternatively, on the opposite sides of the transfer chamber 2400, the first group of process chambers 2600 may be disposed in a lower layer, and the second group of process chambers 2600 may be disposed in an upper layer. The first group of process chambers 2600 may be distinguished from the second group of process chambers 2600 according to the types of chemicals used and the types of cleaning methods.

In the following embodiment, an apparatus for cleaning a substrate W using processing fluids, such as a high-temperature sulfuric acid, an alkaline chemical, an acidic chemical, a rinsing solution, and a drying gas, will be described as an example. However, without being limited thereto, the spirit and scope of the inventive concept are applicable to various types of apparatuses that perform a process, such as an etching process, while rotating a substrate W.

Figure 3:
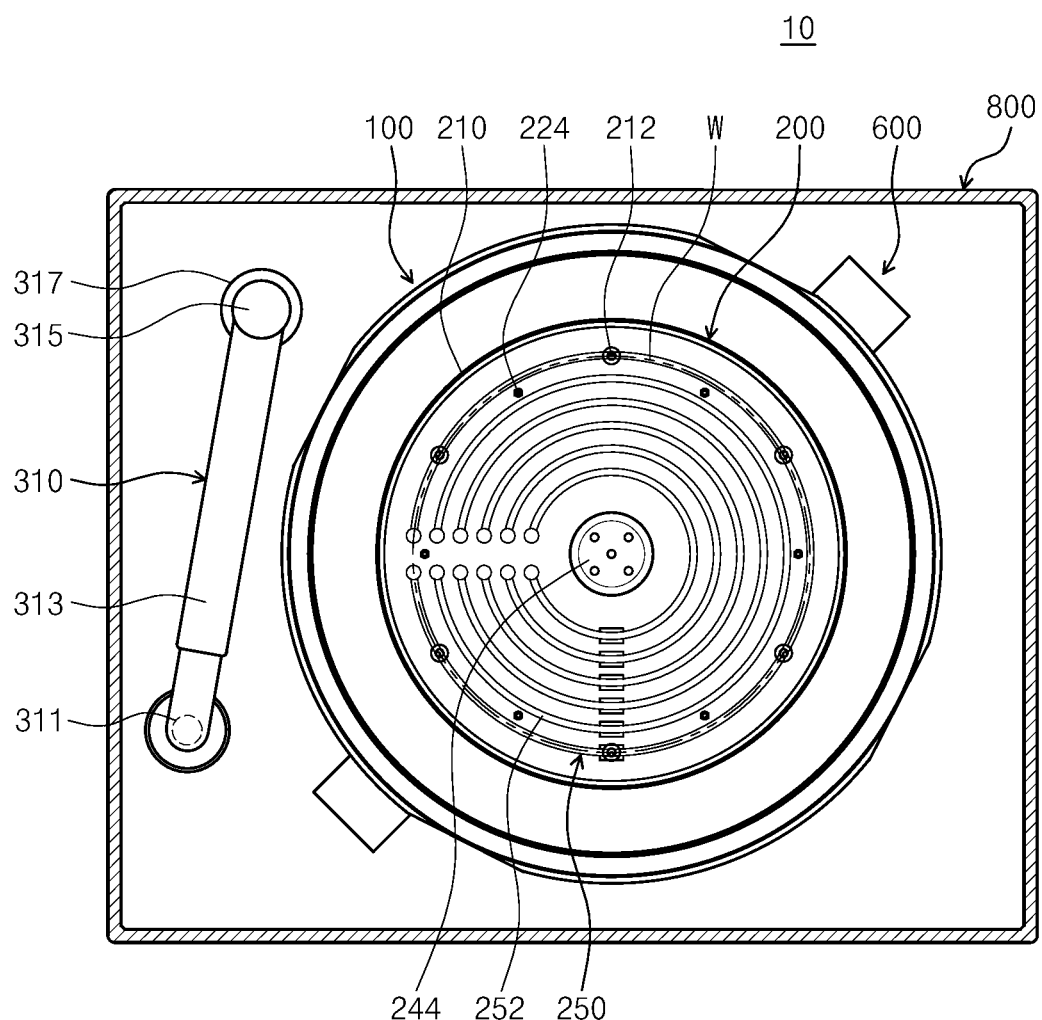
FIG. 3 is a plan view illustrating the substrate processing apparatus of FIG. 2.
Figure 4:
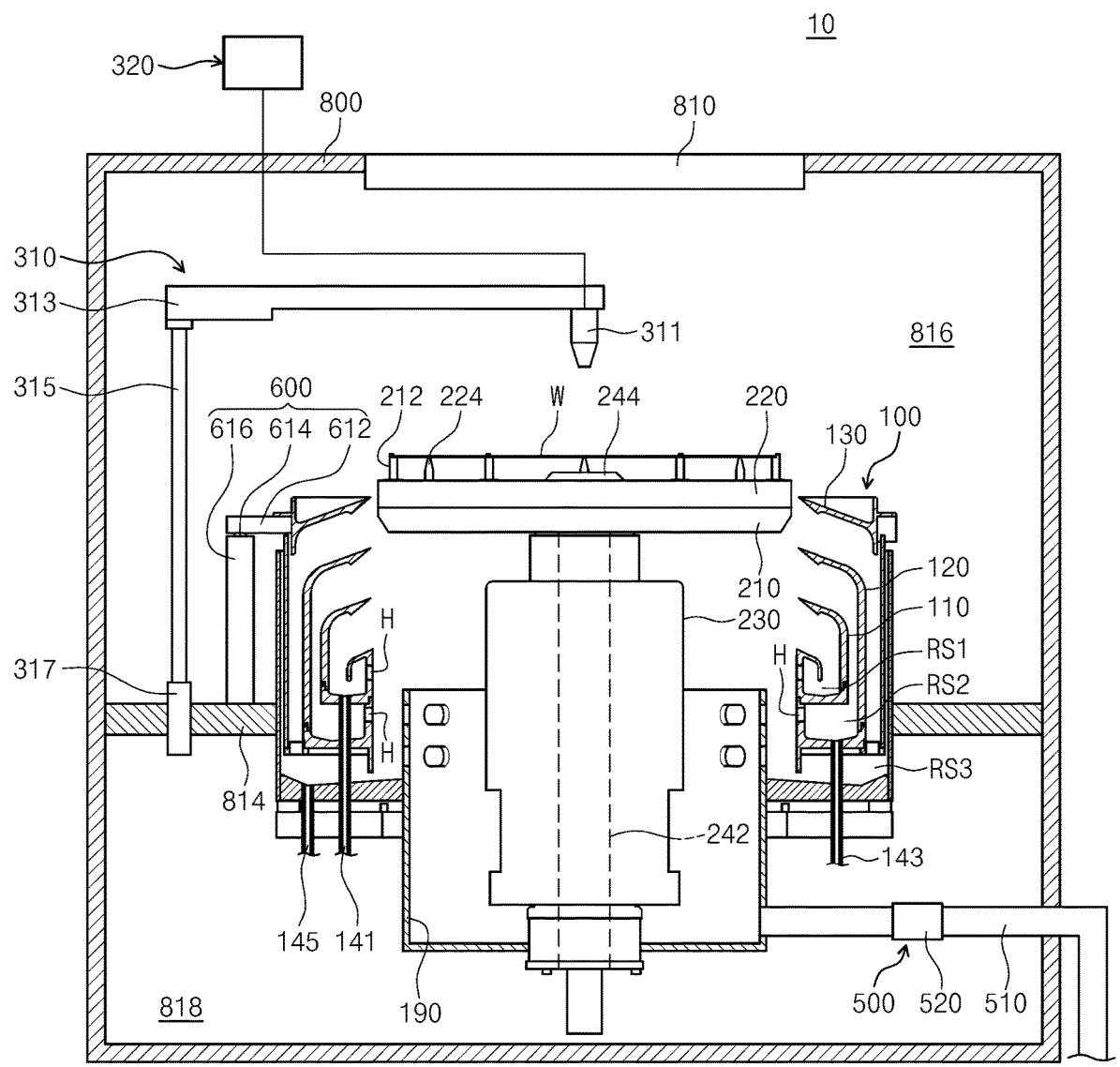
FIG. 4 is a sectional view illustrating the substrate processing apparatus of FIG. 2.

FIG. 3 is a plan view illustrating the substrate processing apparatus 10 of FIG. 2, and FIG. 4 is a sectional view illustrating the substrate processing apparatus 10 of FIG. 2.

Referring to FIGS. 3 and 4, the substrate processing apparatus 10 includes a chamber 800, a processing vessel 100, a substrate support unit 200, a heating unit 280, a processing liquid supply unit 300, a process exhaust unit 500, and a lifting unit 600.

The chamber 800 has a sealed inner space. The chamber 800 is equipped with an air-flow supply unit 810 at the top thereof. The air-flow supply unit 810 forms a downward flow of air in the chamber 800.

The air-flow supply unit 810 filters and supplies high-humidity outside air into the chamber 800. The high-humidity outside air forms a downdraft while being supplied into the chamber 800 through the air-flow supply unit 810. The downdraft provides a uniform air flow over a substrate W and releases contaminants generated in the process in which the surface of the substrate W is processed by processing fluids, along with air to the process exhaust unit 500 through recovery bowls 110, 120, and 130 of the processing vessel 100.

The chamber 800 is partitioned into a process area 816 and a maintenance area 818 by a horizontal partition wall 814. The processing vessel 100 and the substrate support unit 200 are located in the process area 816. An actuator of the lifting unit 600, an actuator connected with the processing liquid supply unit 300, and a supply line are located in the maintenance area 818, in addition to drain lines 141, 143, and 145 connected with the processing vessel 100 and an exhaust line 510. The maintenance area 818 is isolated from the process area 816.

The processing vessel 100 has an open-topped cylindrical shape and provides a process space for processing the substrate W. The open top side of the processing vessel 100 serves as a passage through which the substrate W is carried into or out of the processing vessel 100. The substrate support unit 200 is located in the process space. The substrate support unit 200 rotates the substrate W while supporting the substrate W during processing.

The processing vessel 100 has, at the bottom thereof, a lower space to which an exhaust duct 190 is connected to perform forced exhaust. The first to third recovery bowls 110, 120, and 130 are disposed in multiple stages in the processing vessel 100 to take in and suction processing liquids and gases scattered from the rotating substrate W.

The first to third annular recovery bowls 110, 120, and 130 have exhaust holes H that connect to one common annular space.

Specifically, each of the first to third recovery bowls 110, 120, and 130 includes a bottom surface having an annular ring shape and a sidewall having a cylindrical shape extending from the bottom surface. The second recovery bowl 120 surrounds the first recovery bowl 110 and is spaced apart from the first recovery bowl 110. The third recovery bowl 130 surrounds the second recovery bowl 120 and is spaced apart from the second recovery bowl 120.

The first to third recovery bowls 110, 120, and 130 have first to third recovery spaces RS1, RS2, and RS3, respectively, into which an air flow containing processing liquids and fumes scattered from the substrate W is introduced. The first recovery space RS1 is defined by the first recovery bowl 110, the second recovery space RS2 is defined by a spacing space between the first recovery bowl 110 and the second recovery bowl 120, and the third recovery space RS3 is defined by a spacing space between the second recovery bowl 120 and the third recovery bowl 130.

The top side of each of the first to third recovery bowls 110, 120, and 130 is open in the center. The first to third recovery bowls 110, 120, and 130 each include an inclined surface that is upwardly inclined such that the distance between the inclined surface and the corresponding bottom surface gradually increases from the connected sidewall to the opening. Processing liquids scattered from the substrate W flow into the recovery spaces RS1, RS2, and RS3 along the top sides of the first to third recovery bowls 110, 120, and 130.

A first processing liquid introduced into the first recovery space RS1 is discharged to the outside through the first recovery line 141. A second processing liquid introduced into the second recovery space RS2 is discharged to the outside through the second recovery line 143. A third processing liquid introduced into the third recovery space RS3 is discharged to the outside through the third recovery line 145.

The processing liquid supply unit 300 discharges a high-temperature chemical for etching the surface of the substrate W. For example, the chemical may be a sulfuric acid, a phosphoric acid, or a mixture thereof.

A processing liquid nozzle member 310 includes a nozzle 311, a nozzle arm 313, a support rod 315, and a nozzle actuator 317. The nozzle 311 receives a processing liquid from a supply unit 320. The nozzle 311 discharges the processing liquid to the surface of the substrate W. The nozzle arm 313 extends in one direction, and the nozzle 311 is mounted on the tip end of the nozzle arm 313. The nozzle arm 313 supports the nozzle 311. The support rod 315 is attached to the rear end of the nozzle arm 313. The support rod 315 is located below the nozzle arm 313. The support rod 315 is disposed perpendicular to the nozzle arm 313. The nozzle actuator 317 is provided at a lower end of the support rod 315. The nozzle actuator 317 rotates the support rod 315 about the longitudinal axis of the support rod 315. The nozzle arm 313 and the nozzle 311 swing about the support rod 315 by the rotation of the support rod 315. The nozzle 311 may swing between outside and inside the processing vessel 100. Further, the nozzle 311 may discharge the processing liquid while swinging between the center of the substrate W and the edge region thereof.

The process exhaust unit 500 is responsible for evacuation of the processing vessel 100. For example, the process exhaust unit 500 provides exhaust pressure (suction pressure) to a recovery bowl that recovers a processing liquid during processing, among the first to third recovery bowls 110, 120, and 130. The process exhaust unit 500 includes the exhaust line 510 connected with the exhaust duct 190 and a damper 520. The exhaust line 510 receives exhaust pressure from an exhaust pump (not illustrated) and is connected with a main exhaust line buried beneath the floor of a semiconductor manufacturing line.

The processing vessel 100 is combined with the lifting unit 600 for changing the vertical location of the processing vessel 100. The lifting unit 600 linearly moves the processing vessel 100 in the vertical direction. The height of the processing vessel 100 relative to the substrate support unit 200 is varied as the processing vessel 100 moves upward and downward.

The lifting unit 600 includes a bracket 612, a moving shaft 614, and an actuator 616. The bracket 612 is fixedly attached to the outer wall of the processing vessel 100. The moving shaft 614, which is vertically moved by the actuator 616, is fixedly coupled to the bracket 612. When the substrate W is loaded on, or unloaded from, a chuck stage 210, the processing vessel 100 moves downward to allow the chuck stage 210 to further protrude beyond the processing vessel 100. Furthermore, during processing, the height of the processing vessel 100 is adjusted according to the types of processing liquids supplied to the substrate W, to allow the processing liquids to be introduced into the preset recovery bowls 110, 120, and 130, respectively. The vertical location of the processing vessel 100 relative to the substrate W is varied. The processing vessel 100 may vary the types of processing liquids and pollutant gases recovered into the respective recovery spaces RS1, RS2, and RS3. According to an embodiment, the lifting unit 600 vertically moves the processing vessel 100 to vary the vertical location of the processing vessel 100 relative to the substrate support unit 200.

Figure 5:
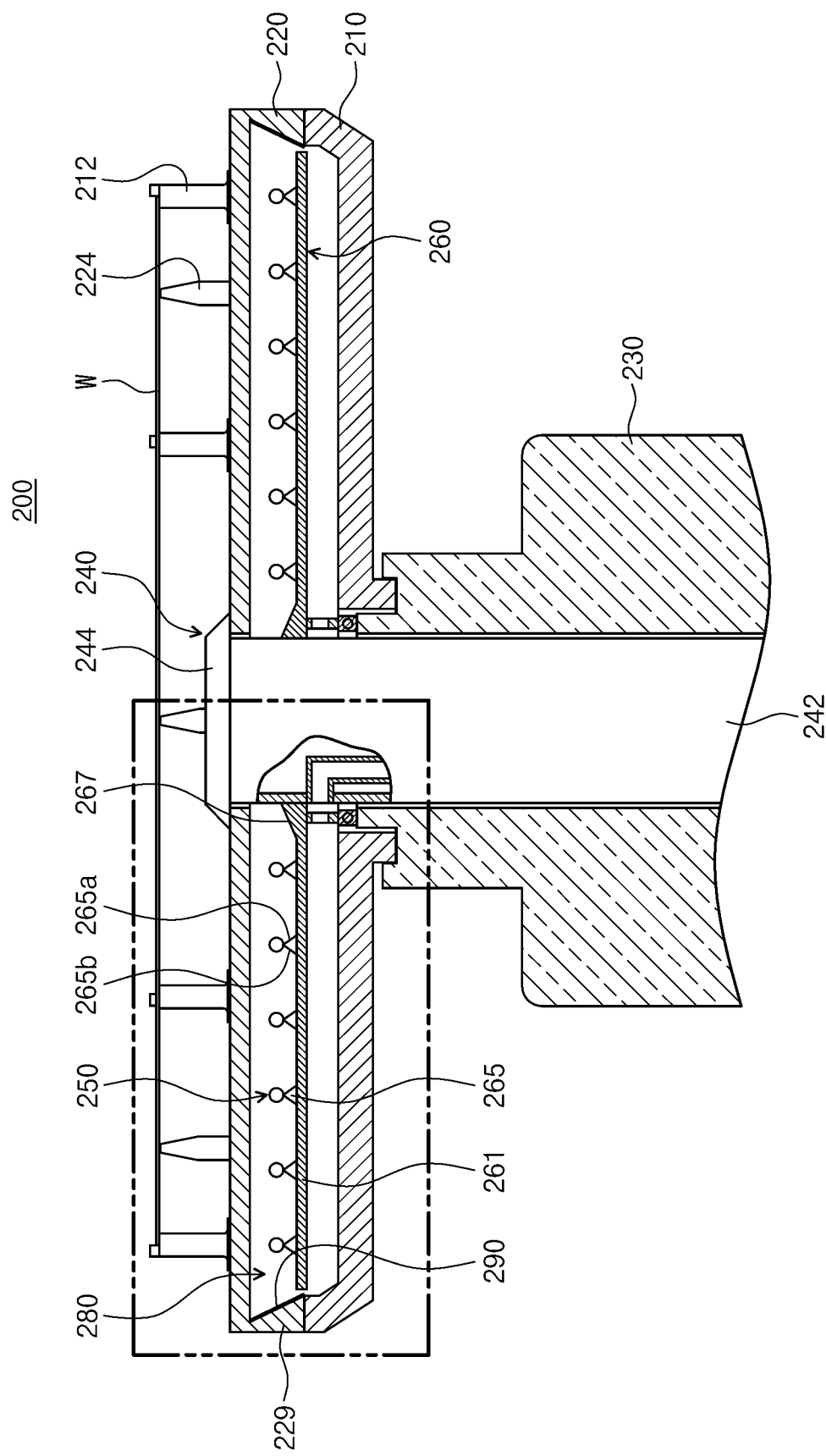
FIG. 5 is a sectional view illustrating a substrate support unit and a heating unit of FIG. 3.
Figure 6:
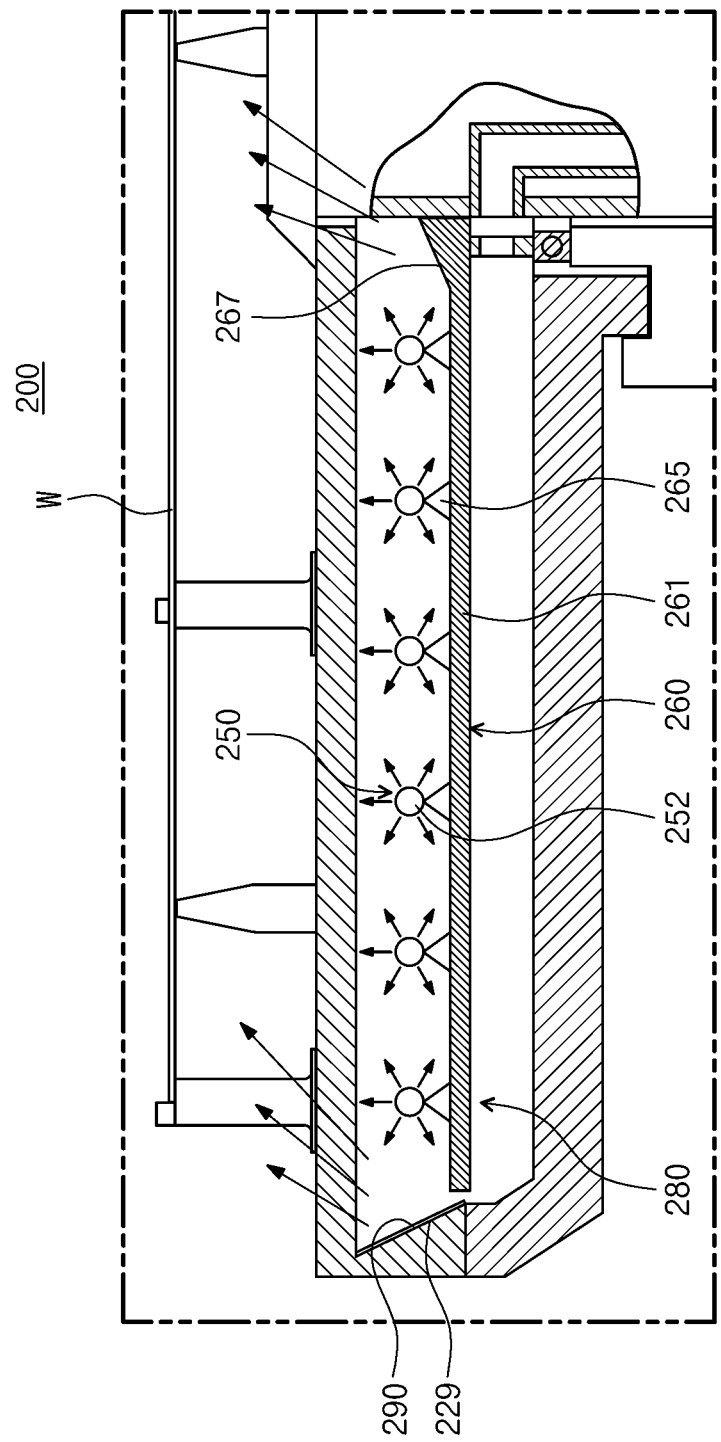
FIG. 6 is a blowup of part of the heating unit of FIG. 5.

FIG. 5 is a sectional view illustrating the substrate support unit 200 and the heating unit 280 of FIG. 3, and FIG. 6 is a blowup of part of the heating unit 280 of FIG. 5.

Referring to FIGS. 3 to 6, the substrate support unit 200 supports the substrate W during processing. The substrate support unit 200 may be rotated by an actuator during processing.

The substrate support unit 200 includes the chuck stage 210, a quartz window 220, a rotary part 230, a back nozzle 240, and the heating unit 280.

The chuck stage 210 has a circular upper surface. The chuck stage 210 is combined with and rotated by the rotary part 230.

The rotary part 230 has a hollow shape. The rotary part 230 is combined with the chuck stage 210 and rotates the chuck stage 210.

The quartz window 220 is located on the chuck stage 210. The quartz window 220 protects heating members 250. The quartz window 220 may be transparent. The quartz window 220 may be rotated together with the chuck stage 210. The quartz window 220 includes support pins 224. The support pins 224 are arranged on a peripheral portion of an upper surface of the quartz window 220 with a predetermined interval therebetween. The support pins 224 protrude upward from the quartz window 220. The support pins 224 support the bottom side of the substrate W to space the substrate W apart upward from the quartz window 220.

Chucking pins 212 are located on the quartz window 220. The chucking pins 212 align the substrate W to locate the substrate W, which is supported by the plurality of support pins 224, in a correct position. During processing, the chucking pins 212 make contact with the side of the substrate W to prevent the substrate W from deviating from the correct position.

The quartz window 220 includes a reflective member 290 that reflects light energy lost in the lateral direction of the quartz window 220 toward the substrate W. The reflective member 290 may be provided on an inner surface 229 of the edge of the quartz window 220 that surrounds the heating members 250. The inner surface 229 of the edge of the quartz window 220 is inwardly inclined so as to be closer to the center of the quartz window 220 from top to bottom. The reflective member 290 may be a reflective film attached to the inner surface 229 of the quartz window 220 or a reflective material with which the inner surface 229 of the quartz window 220 is coated. Light energy emitted from the heating members 250 is reflected toward the edge portion of the substrate W by the reflective member 290 on the inner surface 229 of the quartz window 220 (refer to arrows of FIG. 6). Accordingly, the degree of concentration of light on the edge of the substrate W may be increased, which results in an improvement in temperature uniformity.

The back nozzle 240 sprays a chemical onto the back side of the substrate W. The back nozzle 240 includes a nozzle body 242 and a chemical spray part 244. The chemical spray part 244 is located on the central portion of the quartz window 220. The nozzle body 242 is axially inserted through the hollow rotary part 230. The nozzle body 242 may have a chemical delivery line, a gas supply line, and a purge gas supply line therein. The chemical delivery line supplies an etchant for etching the back side of the substrate W to the chemical spray part 244. The gas supply line supplies a nitrogen gas for adjustment of etch uniformity to the back side of the substrate W. The purge gas supply line supplies a nitrogen purge gas to prevent the etchant from infiltrating between the quartz window 220 and the nozzle body 242.

The heating unit 280 is mounted in the substrate support unit 200. The heating unit 280 heats the substrate W during processing. The heating unit 280 includes the heating members 250 and a base plate 260.

The heating members 250 are installed at the top of the chuck stage 210. The heating members 250 may be heating light sources that emit light energy. The heating members 250 have different diameters. The plurality of heating members 250 may have a ring shape. For example, the heating members 250 may be implemented with a plurality of lamps 252 having a ring shape. Each of the lamps 252 may be controlled by a temperature controller (not illustrated).

Although the heating members 250 have been described as being implemented with the lamps 252 in a ring shape, the heating members 250 are not limited thereto. The heating members 250 may be light sources of a ring type or light sources of a point type in view of the shape thereof. Furthermore, a light source such as a light emitting diode (LED), a laser diode, or a vertical cavity surface emitting laser (VCSEL) may be employed for the heating members 250.

The heating members 250 may be subdivided to correspond to a plurality of concentric sections. The lamps 252 are provided in the sections to individually heat the sections, respectively. The lamps 252 may be ring-shaped lamps concentrically arranged at different radii with respect to the center of the chuck stage 210. Although six lamps 252 are illustrated in this embodiment, this is merely illustrative, and the number of lamps 252 may be increased or decreased depending on the degree to which the temperature of the substrate W is controlled to a desired temperature. Among the six lamps 252, the outermost lamp 252 may have the same diameter as the substrate W for a temperature rise at the edge portion of the substrate W.

The heating members 250 may control the temperatures of the individual sections and may thus continuously raise or lower temperature according to the radius of the substrate W during processing. In the structure in which the lamps 252 are rotated together with the chuck stage 210, a slip ring may be used to supply power to the heating members 250.

The base plate 260 is provided between the heating members 250 and the chuck stage 210. The base plate 260 may be a reflective plate that reflects and transfers heat (light energy) emitted from the lamps 252 to the substrate W. The base plate 260 may be mounted on the nozzle body 242 installed through the central space of the rotary part 230. The base plate 260 extends downward from the inside end thereof. The base plate 260 may be of a stationary type that does not rotate together with the chuck stage 210.

The base plate 260 may include a plurality of reflective protrusions 265 and an inclined reflective surface 267.

The plurality of reflective protrusions 265 protrude from the top side of the base plate 260. The reflective protrusions 265 have a ring shape. The reflective protrusions 265 are located directly below the lamps 252, respectively. Each of the reflective protrusions 265 may have a triangular cross-section that becomes gradually wider away from the corresponding lamp 252. That is, the reflective protrusion 265 serves to spread light energy of the lamp 252. For example, the reflective protrusion 265 includes a first sidewall 265a and a second sidewall 265b. The first side wall 265a and the second sidewall 265b may be inclined so as to be closer to the lamp 252 from bottom to top. The first sidewall 265a and the second sidewall 265b may be symmetric to each other with respect to a virtual vertical line passing through the center of the reflective protrusion 265 and may have the same slope. The lamp 252 is located at the uppermost vertex of the reflective protrusion 265.

Light energy radiating downward from the lamp 252 is reflected by the first sidewall 265a and the second sidewall 265b of the reflective protrusion 265 and spread in all directions.

The inclined reflective surface 267 is located on the base plate 260 inward of the lamps 252. The inclined reflective surface 267 may be formed to be a flat surface, a concave curved surface, or a convex curved surface, and the curved surface may be formed in the shape of part of a circle or an ellipse. In the case where the curved surface has an elliptical shape, the curvature of the curved surface may be varied to increase the degree of concentration of light toward the central region of the substrate W.

The surface of the base plate 260 may be made of metal. The surface of the base plate 260 is made of metal with excellent thermo-reflectance. For example, the surface of the base plate 260 may be made of gold, silver, or aluminum. Alternatively, the surface of the base plate 260 may be made of different metal with excellent thermo-reflectance.

The base plate 260 may spread light energy (heat) using the reflective protrusions 265 below the lamps 252 and may thus more uniformly provide the light energy to the substrate W. In addition, the base plate 260 may provide an effect of reducing the thermal strain of a base reflective plate 261 by using the reflective protrusions 265.

The base plate 260 may include cooling fins (not illustrated) for heat rejection. A cooling gas may be allowed to flow over the bottom of the base reflective plate 261 to suppress heat generation of the base plate 260. For example, the nozzle body 242 has a spray port 248 for spraying the cooling gas onto the bottom of the base reflective plate 261.

As described above, the inventive concept increases the degree of concentration of light on the edge and the central region of the substrate W to compensate for temperature, thereby improving the thermal uniformity of the substrate W.

Figure 7:
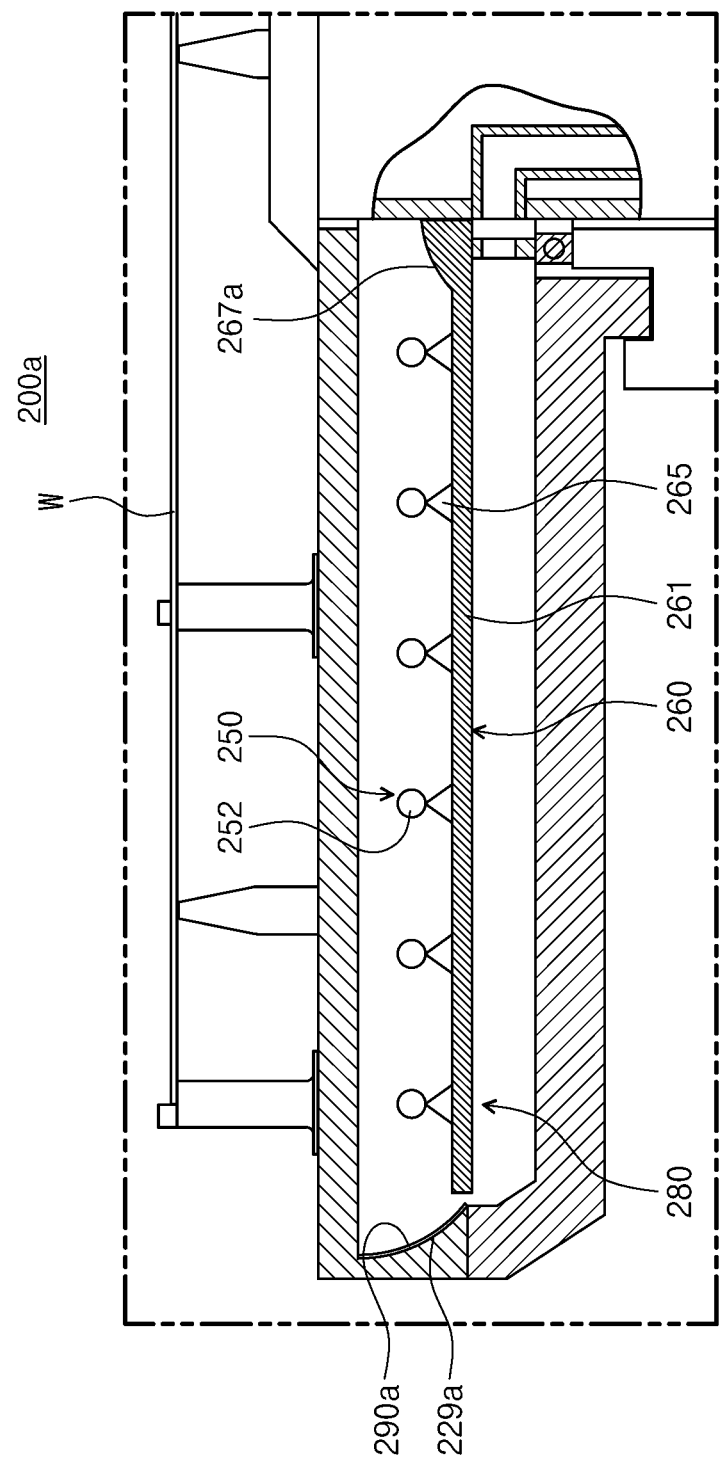
FIG. 7 is a view illustrating a modified example of the substrate support unit.

FIG. 7 is a view illustrating a modified example of the substrate support unit 200.

A substrate support unit 200a according to the modified example includes a chuck stage 210, a quartz window 220, a rotary part 230, a back nozzle 240, and a heating unit 280. The aforementioned components of the substrate support unit 200a have configurations and functions substantially similar to those of the chuck stage 210, the quartz window 220, the rotary part 230, the back nozzle 240, and the heating unit 280 illustrated in FIG. 5. Therefore, the following description of the modified example will be focused on the difference therebetween.

The modified example is characterized in that an inner surface 229a of the quartz window 220 is formed to be concave toward the edge of a substrate W. In addition, a reflective member 290a may also have a concave form to correspond to the curved inner surface 229a. The reflective member 290a may preferably have a longitudinal section in the shape of part of an ellipse.

Meanwhile, an inclined reflective surface 267a may be provided as a concave curved surface on the central portion of a base plate 260 to increase the degree of concentration of light on the central region of the substrate W. Light emitted from the innermost lamp 252 may be reflected by the concave curved surface of the inclined reflective surface 267a and may be directed toward the central region of the substrate W. Accordingly, the degree of concentration of light on the central region of the substrate W may be increased, which results in an improvement in the etch rate of the substrate W.

Figure 8A:
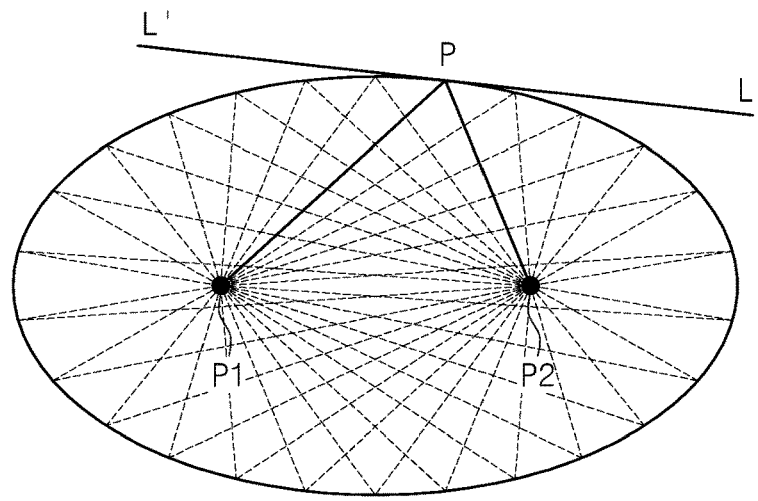
FIGS. 8A and 8B are schematic views illustrating a method for designing a reflective member illustrated in FIG. 7.
Figure 8B:
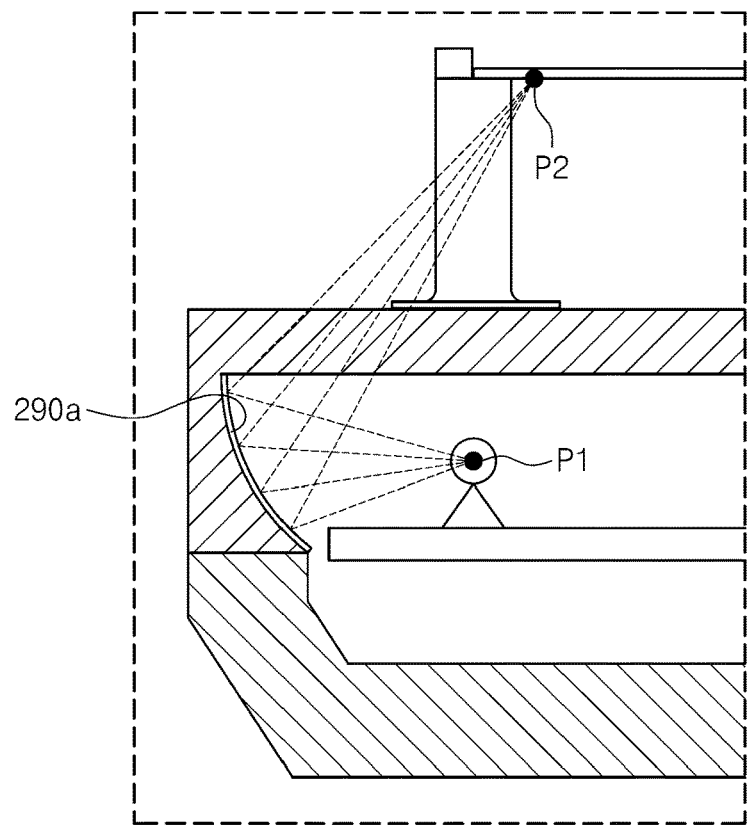

FIGS. 8A and 8B are schematic views illustrating a method for designing the reflective member 290a illustrated in FIG. 7.

FIGS. 8A and 8B illustrate the principle by which an ellipse is formed. The ellipse is defined as a curve drawn in such a manner that pins are placed at two focal points P1 and P2 on a plane, a string of an appropriate length is tied at each end to the two pins, and the tip P of a pen traces an ellipse when it is moved while pulling the string taut.

That is, the ellipse is defined as the locus of points for each of which the sum of the distances to the two focal points P1 and P2 is constant. The ellipse as illustrated in FIG. 8A is obtained by drawing a curve while pulling the string taut with the tip P of the pen.

As described above, the ellipse is formed with respect to the two focal points, because the sum of the distances from the tip P of the pen to the focal point P1 (corresponding to a lamp in the inventive concept) and the focal point P2 (corresponding to a target at the edge of a substrate on which light is concentrated, in the inventive concept) on the plane is constant. As illustrated in FIG. 8A, the direction in which the tip P of the pen is to move while the ellipse is formed corresponds to the direction of the tangent LL' at the point P of the ellipse, and the angle ∠FPT is equal to the angle ∠F'PT as already proven in geometry (refer to equation of an ellipse).

In the case where the inside of the ellipse is formed of a mirror or a reflective surface and a light source (a lamp) is placed at the focal point P1 of the ellipse, light rays from the focal point P1 are reflected by the inside of the ellipse to the other focal point P2 (the target at the edge of the substrate), as illustrated in FIG. 8B. The elliptical surface of the reflective member 290a may be designed in such a manner, and light energy of the lamp may be concentrated on the target at the edge of the substrate by the curved surface of the reflective member 290a.

Figure 9:
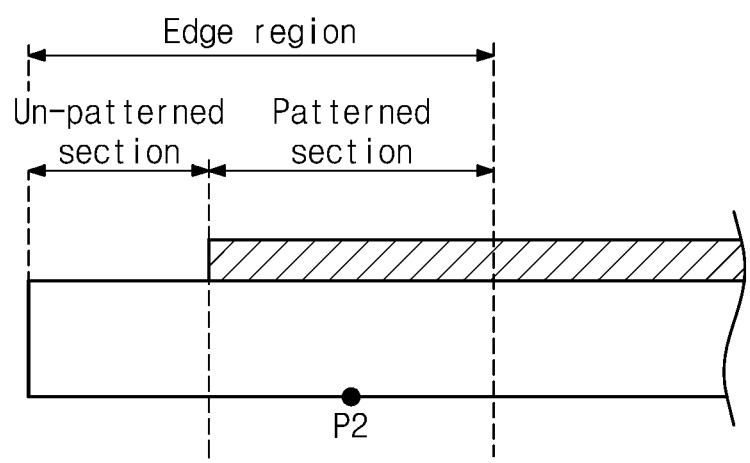
FIG. 9 is a view illustrating the position of a target on which light is concentrated.

FIG. 9 is a view illustrating the position of the above-described target on which light is concentrated.

Referring to FIG. 9, the target P2 may be located in an edge region of the substrate. More preferably, the target P2 may be located close to the center of a patterned section in the edge region of the substrate, other than an un-patterned section in the edge region thereof.

Figure 10:
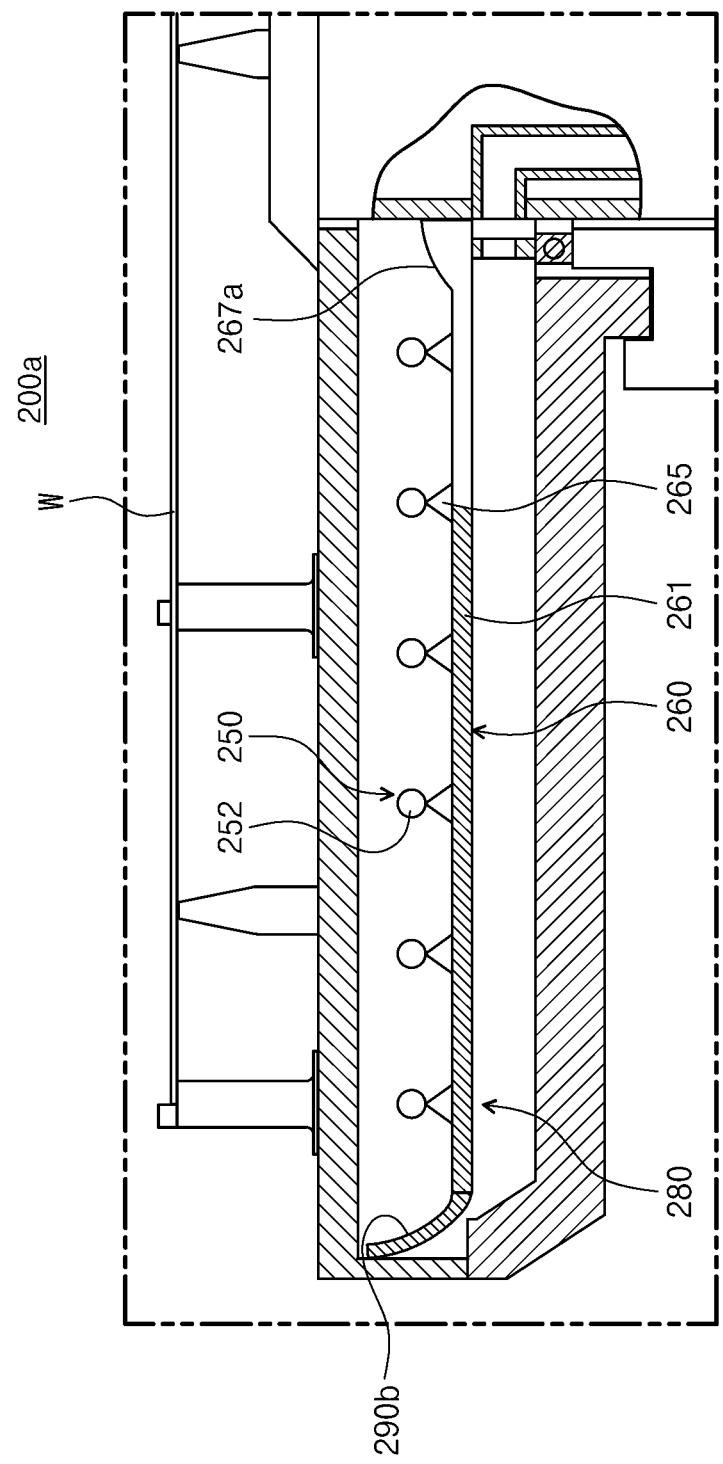
FIG. 10 is a view illustrating a modified example of the reflective member.

FIG. 10 is a view illustrating a modified example of the reflective member.

According to the modified example, a reflective member 290b may be provided at the base plate 260. The reflective member 290b may be attached to the edge of the base plate 260 as a separate component, or may be integrated with the base plate 260. The reflective member 290b has a configuration and a function similar to those of the reflective member 290a illustrated in FIG. 7. Therefore, a specific description thereabout will be omitted.

According to the embodiments, the inventive concept employs the reflector structure for spreading light of the lamps, thereby providing an advantageous effect of improving the temperature distribution on the substrate.

In addition, the inventive concept increases the degree of concentration of light on the edge and the central region of the substrate, thereby providing an advantageous effect of improving the etch rate in the substrate processing apparatus.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for supporting a substrate, the apparatus comprising:
    a chuck stage having an inner space defined by a base surface and sidewalls;
    a heating unit provided in the inner space, wherein the heating unit includes a base plate having a disk shape with an opening in the center and a heat generation part mounted on the base plate and having heating light sources configured to emit light energy;
    a quartz window configured to cover the inner space, the quartz window having an upper surface on which the substrate is placed; and
    a reflective member configured to reflect light energy lost in a lateral direction of the chuck stage toward the substrate.

2. The apparatus of claim 1, wherein the reflective member is provided on an inner surface of an edge of the quartz window that surrounds the heat generation part.

3. The apparatus of claim 2, wherein the inner surface of the edge of the quartz window is inclined so as to be closer to the center of the quartz window from top to bottom.

4. The apparatus of claim 2, wherein the inner surface of the edge of the quartz window is formed to be concave toward an edge of the substrate.

5. The apparatus of claim 1, wherein the reflective member is formed of a reflective plate or a reflective coating film.

6. The apparatus of claim 1, further comprising:
    a rotary part combined with the chuck stage to rotate the chuck stage, the rotary part having a hollow shape; and
    a back nozzle inserted through the rotary part and located in the center of an upper portion of the chuck stage, the back nozzle being configured to spray a processing liquid onto a rear surface of the substrate.

7. The apparatus of claim 2, wherein the heating light sources are formed of ring-shaped lamps concentrically arranged at different radii with respect to the center of the base plate.

8. The apparatus of claim 7, wherein the base plate is formed of a reflector configured to reflect light energy of the lamps upwards.

9. The apparatus of claim 8, wherein the base plate includes reflective protrusions located below the lamps and protruding in a protrusion shape to spread the light energy radiating from the lamps.

10. The apparatus of claim 9, wherein each of the reflective protrusions has a triangular cross-section that becomes gradually wider away from the corresponding lamp.

11. The apparatus of claim 1, wherein the base plate further includes an inclined reflective surface provided on a central portion of the base plate to increase a degree of concentration of light on a central region of the substrate.

12. The apparatus of claim 1, wherein the base plate further includes a convex reflective surface provided on a central portion of the base plate to increase a degree of concentration of light on a central region of the substrate.

13. The apparatus of claim 1, wherein the reflective member is provided on an inner surface of an edge of the quartz window that surrounds the heat generation part, and includes a curved reflective surface to concentrate the light energy of the heating light sources on a target at a predetermined location in an edge region of the substrate.

14. The apparatus of claim 13, wherein a longitudinal section of the curved reflective surface has the shape of part of an ellipse.

15. The apparatus of claim 13, wherein a longitudinal section of the curved reflective surface is part of an elliptical section with a luminous point of the heating light source and the target as two focal points of an ellipse.

16. The apparatus of claim 13, wherein the target is located close to the center of a patterned section in the edge region of the substrate, other than an un-patterned section in the edge region thereof.

17. An apparatus for processing a substrate, the apparatus comprising:
    a processing vessel that is open at the top;
    a substrate support unit located in the processing vessel and configured to support the substrate;
    a processing liquid supply unit configured to supply a processing liquid to the substrate placed on the substrate support unit; and
    a heating unit provided in the substrate support unit and configured to emit light energy for heating the substrate,
    wherein the substrate support unit includes:
    a chuck stage having an inner space defined by a base surface and sidewalls;
    a quartz window configured to cover the inner space, the quartz window having an upper surface on which the substrate is placed; and
    a reflective member configured to reflect light energy lost in a lateral direction of the chuck stage toward the substrate.

18. The apparatus of claim 17, wherein the reflective member is provided on an inner surface of an edge of the quartz window that surrounds a heat generation part.

19. The apparatus of claim 18, wherein the inner surface of the edge of the quartz window is inclined so as to be closer to the center of the quartz window from top to bottom, or is formed to be concave toward an edge of the substrate.

20. The apparatus of claim 17, wherein the heating unit includes:
   a heat generation part provided in the substrate support unit and having ring-shaped lamps concentrically arranged at different radii with respect to the center of the substrate support unit; and
   a reflective plate having reflective protrusions located below the lamps, the reflective protrusions protruding in a protrusion shape to spread light energy radiating from the lamps.

21. The apparatus of claim 20, wherein the substrate support unit further includes:
   a rotary part combined with the chuck stage to rotate the chuck stage, the rotary part having a hollow shape; and
   a back nozzle inserted through the rotary part and located in the center of an upper portion of the chuck stage, the back nozzle being configured to spray a processing liquid onto a rear surface of the substrate, and
   wherein each of the reflective protrusions is formed in a ring shape that has the same diameter as the corresponding lamp, the reflective protrusion having a triangular cross-section that becomes gradually wider away from the corresponding lamp.

22. The apparatus of claim 20, wherein the reflective plate further includes a reflective surface provided on a central portion of the reflective plate to increase a degree of concentration of light on a central region of the substrate.

23. The apparatus of claim 22, wherein the reflective surface has the shape of any one of a flat surface, a concave curved surface, or a convex curved surface.

24. The apparatus of claim 17, wherein the reflective member is provided on an inner surface of an edge of the quartz window that surrounds a heat generation part, and includes a curved reflective surface to concentrate the light energy of a heating light sources on a target at a predetermined location in an edge region of the substrate.

25. The apparatus of claim 24, wherein a longitudinal section of the curved reflective surface has the shape of part of an ellipse.

26. The apparatus of claim 24,
   wherein a longitudinal section of the curved reflective surface is part of an elliptical section with a luminous point of the heating light source and the target as two focal points of an ellipse.

27. The apparatus of claim 24, wherein the target is located close to the center of a patterned section in the edge region of the substrate, other than an un-patterned section in the edge region thereof.

* * * * *